United States Patent
Hashimura et al.

(10) Patent No.: US 7,121,925 B2
(45) Date of Patent: Oct. 17, 2006

(54) METHOD FOR DICING SEMICONDUCTOR WAFER INTO CHIPS

(75) Inventors: Masaki Hashimura, Aichi (JP); Takao Sato, Aichi (JP); Koichi Ota, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 335 days.

(21) Appl. No.: 10/240,251

(22) PCT Filed: Mar. 14, 2001

(86) PCT No.: PCT/JP01/02015

§ 371 (c)(1),
(2), (4) Date: Sep. 30, 2002

(87) PCT Pub. No.: WO01/75954

PCT Pub. Date: Nov. 10, 2001

(65) Prior Publication Data

US 2003/0121511 A1   Jul. 3, 2003

(30) Foreign Application Priority Data

Mar. 31, 2000  (JP) .......................... 2000-099895
Mar. 31, 2000  (JP) .......................... 2000-099896

(51) Int. Cl.
*H01L 21/00* (2006.01)

(52) U.S. Cl. .......................................... 451/29; 451/38
(58) Field of Classification Search .................. 29/412, 29/413, 414, 415; 451/38, 39, 40, 41, 29
See application file for complete search history.

(56) References Cited

U.S. PATENT DOCUMENTS

| 5,197,234 A | * | 3/1993 | Gillenwater ................ 451/29 |
| 5,508,206 A | * | 4/1996 | Glenn et al. ................ 438/68 |
| 5,593,528 A | * | 1/1997 | Dings et al. ................ 156/154 |
| 5,804,009 A | * | 9/1998 | Dings et al. ................ 156/154 |
| 5,989,689 A | * | 11/1999 | Komatsu ................ 428/201 |
| 6,033,927 A | | 3/2000 | Shibata et al. |
| 6,342,404 B1 | | 1/2002 | Shibata et al. |

FOREIGN PATENT DOCUMENTS

| JP | 54-88767 | 7/1979 |
| JP | 55-83236 | 6/1980 |

(Continued)

OTHER PUBLICATIONS

International Search Report dated May 31, 2001 with partial translation.

(Continued)

*Primary Examiner*—Jacob K. Ackun, Jr.
(74) *Attorney, Agent, or Firm*—McGinn & Gibb, PLLC (57) ABSTRACT

A method for dividing a semiconductor wafer into chips according to the present invention is a method for dividing a semiconductor wafer into a large number of semiconductor chips, the semiconductor wafer having a semiconductor layer formed on a substrate. A first method includes the step of forming a blast-resistant mask on a surface of the semiconductor wafer, the blast-resistant mask having a pattern for leaving a grid-like exposed portion as it is and the step of blasting a fine particular blast material to thereby form dividing grooves reaching a predetermined depth of the substrate in the grid-like exposed portion. A second method includes the step of forming first dividing grooves in a surface of the semiconductor wafer in which the semiconductor layer is formed, by dicing, etching or blasting, so that the first dividing grooves have a relatively narrow groove width, and the step of forming second dividing grooves in a surface of the semiconductor wafer in which the semiconductor layer is not formed by dicing, and in positions corresponding to the first dividing grooves, so that the second dividing grooves have a relatively wide groove width.

16 Claims, 8 Drawing Sheets

FOREIGN PATENT DOCUMENTS

| | | |
|---|---|---|
| JP | 56-48148 | 5/1981 |
| JP | 02-43754 | 2/1990 |
| JP | 05-166923 | 7/1993 |
| JP | 05-315646 | 11/1993 |
| JP | 05-343742 | 12/1993 |
| JP | 07-131069 | 5/1995 |
| JP | 10-125958 | 5/1998 |
| JP | 11-177139 | 7/1999 |
| JP | 11-354841 | 12/1999 |
| TW | 242695 | 3/1995 |
| TW | 293135 | 12/1996 |

OTHER PUBLICATIONS

Taiwanese Office Action dated Apr. 4, 2003 with Japanese Translation.

Examiner's comment on Taiwanese Patent No. 293135 published on Dec. 11, 1996.

Taiwanese Office Action dated May 17, 2004 with Japanese Translation.

\* cited by examiner

METHOD FOR DICING SEMICONDUCTOR WAFER INTO CHIPS

TECHNICAL FIELD

The present invention relates to a method in which a semiconductor wafer having a semiconductor layer formed on a substrate is divided into a large number of semiconductor chips.

BACKGROUND ART

As a method for dividing a semiconductor wafer, there is generally adopted a method in which grooves are formed in the wafer by dicing or scribe lines are formed by scribing, and the wafer is then divided by breaking with the aforementioned grooves or the scribe lines as starting points and along the scribe lines. Dicing is a method for forming dicing grooves in the wafer by the relative movement between a rotary blade of a dicer (dicing saw) and the wafer. Scribing is a method for forming scribe lines in the wafer by the relative movement between a sharp-edged blade of a scriber and the wafer. Breaking is a method for pressing the wafer with a press blade or a press roller to thereby divide the wafer by three-point bending.

In a semiconductor wafer using a substrate made of a high-hardness material (e.g. sapphire, GaN, etc.), it is difficult to divide the wafer by breaking only if shallow dicing grooves or scribe lines are formed in the wafer. It is therefore necessary to do breaking after ingenuity such as dicing the wafer deep, scribing the wafer with the substrate thinned on a large scale, or the like, is added. For example, the following methods are known as methods in which a wafer having a gallium-nitride-based compound semiconductor laminated onto the surface of a sapphire substrate is divided into chips.

(1) A method disclosed in Japanese Patent No. 2765644 includes the following steps:
1) the dicing step of cutting grooves deeper than the thickness of the gallium-nitride-based compound semiconductor layer by a dicer;
2) the grinding step of thinning the sapphire substrate by grinding;
3) the scribing step of forming scribe lines in the sapphire substrate with a scriber along the grooves formed in the dicing step; and
4) the dividing step of dividing the wafer into chips after the scribing step.

(2) A method disclosed in Japanese Patent No. 2914014 includes the following steps:
1) the first step of thinning the sapphire substrate by grinding;
2) the second step of etching a p-type layer (gallium-nitride-based compound semiconductor) up to an n-type layer to thereby expose the plane of the n-type layer;
3) the third step of etching or dicing the plane of the n-type layer to thereby expose the plane of the sapphire substrate; and
4) the fourth step of dicing or scribing the thinned sapphire substrate, and cutting off the wafer in the plane of the sapphire substrate exposed in the third step.

(3) A method disclosed in Japanese Patent No. 2780618 includes the following steps:
1) the step of forming first split grooves linearly into the shape of desired chips by etching on the side of the gallium-nitride-based compound semiconductor layer, while forming a plane in a part of the first split grooves so that electrodes can be formed in the plane;
2) the step of forming second split grooves (preferably scribe lines) in the positions corresponding to the first split grooves on the side of the sapphire substrate of the wafer so that the line width of the second split grooves is narrower than the line width of the first split grooves; and
3) the step of dividing the wafer into chips along the first split grooves and the second split grooves.

(4) A method disclosed in Japanese Patent No. 2861991 includes the following steps:
1) the step of forming (by etching) first split grooves linearly into the shape of desired chips on the side of the gallium-nitride-based compound semiconductor layer of the wafer, while forming the first split grooves to reach a depth to an extent that the gallium-nitride-based compound semiconductor layer is penetrated and a part of the sapphire substrate is removed;
2) the step of forming second split grooves (preferably scribe lines) in the positions corresponding to the first split grooves on the side of the sapphire substrate of the wafer so that the line width of the second split grooves is narrower than the line width of the first split grooves; and
3) the step of dividing the wafer into chips along the first split grooves and the second split grooves.

In the methods using dicing and scribing together as in the aforementioned (1) and (2), first, there is a problem that cracking or chipping is apt to occur in the substrate and the semiconductor layer at the time of dicing so that the yield is not very high. In addition, it is necessary to form a large number of dicing grooves and a large number of scribe lines in the wafer. In the present circumstances, those lines have to be formed one by one. Thus, the machining time is so long that the efficiency deteriorates. Further, a rotary blade for dicing is expensive and does not have a very long lifetime.

Further, in the method in which grooves are formed by dicing on the semiconductor layer formation side so as to reach the substrate, and scribe lines are formed in the bottoms of the grooves by a scriber as in the aforementioned (1), the groove width of the grooves has to be made so large that a scribing blade enters the grooves.

On the other hand, in the methods using etching and scribing together as in the aforementioned (3) and (4), first, there is a fear that etching causes damage to the semiconductor layer. Japanese Patent No. 2780618 as in the aforementioned (3) says "Etching is the least efficient way to cause damage to the surface and side faces of the nitride semiconductor" and takes, for instance, dry etching such as reactive ion etching, ion milling, converging beam etching, ECR etching, etc., and wet etching using mixed acid of sulfuric acid and phosphoric acid. Such etching can indeed form a plurality of or a large number of grooves simultaneously, but the machining time is not short at all, so that the efficiency is poor. Further, equipment for etching, particularly equipment for dry etching is so expensive that the machining cost increases.

Further, the reason why the line width of the first split grooves on the semiconductor layer formation side is made larger than the line width of the second split grooves on the sapphire substrate side as in the aforementioned (3) and (4) is to prevent any cutting line generated in the second split grooves from reaching the semiconductor layer even if the line runs obliquely. Accordingly, in embodiments of the same applications, the line width of the first split grooves is made wide to be 80 µm. When the groove width of the grooves formed thus on the semiconductor layer formation side is made wide, there is a problem that the area of the semiconductor layer in each semiconductor chip divided is reduced so that the luminance becomes low. In addition, when the area is prevented from being reduced, there is a problem that the number of semiconductor chips yielded is reduced.

DISCLOSURE OF THE INVENTION

A first object of the present invention is to provide a method for dividing a semiconductor wafer into chips, in which the foregoing problems are solved, the yield is excellent, the efficiency is high, and the equipment cost and the machining cost can be reduced.

A second object of the present invention is to provide a method for dividing a semiconductor wafer into chips, in which the foregoing problems are solved, the area of a semiconductor layer in each semiconductor chip divided is increased so that the luminance can be enhanced or the number of semiconductor chips yielded can be increased, while breaking can be facilitated.

From the first point of view, the present invention provides a method for dividing a semiconductor wafer into a large number of semiconductor chips, the semiconductor wafer having a semiconductor layer formed on a substrate, including the step of forming a blast-resistant mask on a surface of the aforementioned semiconductor wafer, the blast-resistant mask having a pattern for leaving a grid-like exposed portion as it is and the step of blasting a fine particle blast material to the aforementioned semiconductor wafer to thereby form dividing grooves reaching a predetermined depth of the aforementioned substrate in the aforementioned grid-like exposed portion.

Here, it is preferable that the blasting is carried out by blasting the fine particle blast material so as to spread the fine particle blast material over a plurality of grid lines of the grid-like exposed portion while feeding the semiconductor wafer and a blasting machine such as a nozzle relatively to each other in the plane direction of the semiconductor wafer, so that a plurality of dividing grooves are formed simultaneously. This arrangement is made so that the dividing grooves are accurate to be dug in the widthwise direction of the semiconductor wafer, and the efficiency of forming the dividing grooves is enhanced.

In this case, the distance between the semiconductor wafer and the nozzle is not limited particularly, but is preferably 10–150 m. When the distance is too small, damage to the mask increases. When the distance is too large, the machining speed becomes so low that the machining time becomes long.

In addition, the feeding speed is not limited particularly, but is preferably 5–200 mm/sec. When the feeding speed is too low, damage to the mask increases due to heating or the like. When the feeding speed is too high, the degree of verticality in rising faces of machined portions deteriorates.

In addition, the aforementioned blasting while feeding may be repeated a predetermined pass number of times so that the depth of the dividing grooves can be increased. This pass number of times is not limited particularly, but is preferably 3–20 passes.

The width of the dividing grooves is not limited particularly, but is preferably 10–500 μm. When this width is too small, not only is it possible to obtain a sufficient depth but it also becomes difficult to select the fine particle blast material. When this width is too large, the number of semiconductor chips yielded is reduced.

The depth of the dividing grooves in the substrate is not limited particularly, but is preferably 1–100 μm, more preferably 5–50 μm. When this depth is too small, the operation to reduce the thickness of the substrate remaining under the grooves to thereby facilitate the division of the wafer becomes weak. When this depth is too large, it takes much time for blasting.

The material of the fine particle blast material is not limited particularly. However, when the substrate is made of sapphire or GaN, it is preferable that the fine particle blast material is made of a material having a Vickers hardness of at least 120. Specifically, for example, the fine particle blast material is preferably at least one kind selected from alumina, silicon carbide, boron nitride, boron carbide and diamond.

The average particle size of the fine particle blast material is not limited particularly if it is smaller than the width of the dividing grooves. However, the average particle size of the fine particle blast material is preferably ½–¹⁄₂₀ by representation using a ratio to the width of the dividing grooves or preferably 1–30 μm by representation using a numeric value, and more preferably 5–15 μm. When this average particle size is too small, the kinetic energy becomes small. When this average particle size is too large, the smoothness of the dividing grooves is degraded.

The blast rate of the fine particle blast material is not limited particularly, but is preferably 30–100 g/sec. When the blast rate is too low, the machining speed becomes low. When the blast rate is too high, the damage to the mask increases.

The blast pressure of the fine particle blast material is not limited particularly, but is preferably 0.2–0.8 MPa. When the blast pressure is too low, the machining speed becomes low. When the blast pressure is too high, damage to the mask increases.

The dividing grooves may be formed in the surface of the semiconductor wafer in which the semiconductor layer is formed, or may be formed in the surface of the semiconductor wafer in which the semiconductor layer is not formed. Alternatively, the dividing grooves may be formed in both the surfaces of the semiconductor wafer.

In addition to the aforementioned steps, the method according to the present invention may include the step of forming scribe lines by scribing the groove bottoms of the dividing grooves or the surface of the semiconductor wafer opposite to the dividing grooves, and may further include the step of dividing the semiconductor wafer into semiconductor chips by breaking with the scribe lines as starting points.

Further, from the second point of view, the present invention provides a method for dividing a semiconductor wafer into a large number of semiconductor chips, the semiconductor wafer having a semiconductor layer formed on a substrate, including the step of forming first dividing grooves in the surface of the semiconductor wafer in which the semiconductor layer is formed, by dicing, etching or blasting, so that the first dividing grooves have a relatively narrow groove width, and the step of forming second dividing grooves in the surface of the semiconductor wafer in which the semiconductor layer is not formed, and in positions corresponding to the first dividing grooves, so that the second dividing grooves have a relatively wide groove width. Not to say, the words "relatively narrow or wide" are mentioned about the relative relationship between the groove width of the first dividing grooves and the groove width of the second dividing grooves.

Here, as the "dicing", there may be adopted a usual method for dicing with a rotary blade to which diamond abrasive grains have adhered.

As the "etching", there can be taken, for instance, dry etching such as reactive ion etching, ion milling, converging beam etching, ECR etching, etc., wet etching using mixed acid of sulfuric acid and phosphoric acid, and so on. Before the etching, an etching-resistant mask having a pattern for leaving a grid-like exposed portion as it is, is formed in the surface of the semiconductor wafer.

As the "blasting", blasting similar to the aforementioned one may be adopted.

The method may further include the step of forming third dividing grooves in the groove bottoms of the second dividing grooves by dicing so as to establish a relationship that groove width of the first dividing grooves is not larger than groove width of the third dividing grooves, and groove width of the third dividing groove is smaller than groove width of the second dividing grooves.

The groove sectional shape of the second dividing grooves may be made a substantially U-shape or a substantially V-shape which is the deepest in the widthwise central portion thereof.

The groove width of the first dividing grooves is preferably 10–50 μm, more preferably 20–40 μm, (as long as it satisfies the aforementioned relative relationship). When the groove width is small, it is different to form the first dividing grooves. When the groove width is large, the area of the semiconductor layer or the number of the semiconductor chips yielded is reduced remarkably.

The groove width of the second dividing grooves is preferably 15–100 μm, more preferably 20–50 μm, (as long as it satisfies the aforementioned relative relationship). When this groove width is small, the lifetime of the rotary blade of the dicer becomes short (there is a tendency that the thinner the rotary blade is, the shorter its lifetime is). When this groove width is large, the bottom area of the substrate in each semiconductor chip becomes so small that its mechanical stability deteriorates.

The depth of the first dividing grooves and the depth of the second dividing grooves are not limited particularly. However, it is preferable that the first dividing grooves have a relatively small depth while the second dividing grooves have a relatively large depth. Since the groove width of the first. dividing grooves is relatively narrow, a thin rotary blade having a tendency to have a short lifetime is used as the rotary blade of the dicer for the first dividing grooves. It is therefore preferable that the first dividing grooves are not made very deep. On the other hand, since the groove width of the second dividing grooves is relatively wide, a thick rotary blade having a tendency to have a long lifetime is used as the rotary blade of the dicer for the second dividing grooves. It is therefore easy to make the second dividing grooves deep.

Then, the thickness of residual portions of the substrate remaining between the first dividing grooves and the second dividing grooves are made preferably 20–100 μm, more preferably 20–50 μm. According to the present invention, breaking can be facilitated because the dividing grooves are formed in both the surface of the semiconductor wafer in which the semiconductor layer is formed and the surface of the semiconductor wafer in which the semiconductor layer is not formed. By adjusting the thickness of the residual portions to be within the aforementioned range, the breaking can be made most easy.

Further, the second dividing grooves or the third dividing grooves may be formed by dicing so as to reach the first dividing grooves. As a result, the semiconductor wafer can be divided into semiconductor chips directly without producing the aforementioned residual portions. That is, it is possible to omit the step of dividing the semiconductor wafer into semiconductor chips by breaking with the residual portions as starting points.

The present invention from the aforementioned first and second points of view is not limited by the material forming the substrate. However, the present invention is particularly effective when the substrate is made of a high hardness material having a Mohs hardness of at least 8. For example, the present invention is particularly effective in dividing a semiconductor wafer whose substrate is made of sapphire or GaN, and whose semiconductor layer is made of a gallium-nitride-based compound semiconductor.

BEST MODE FOR CARRYING OUT THE INVENTION

Figure 1A:
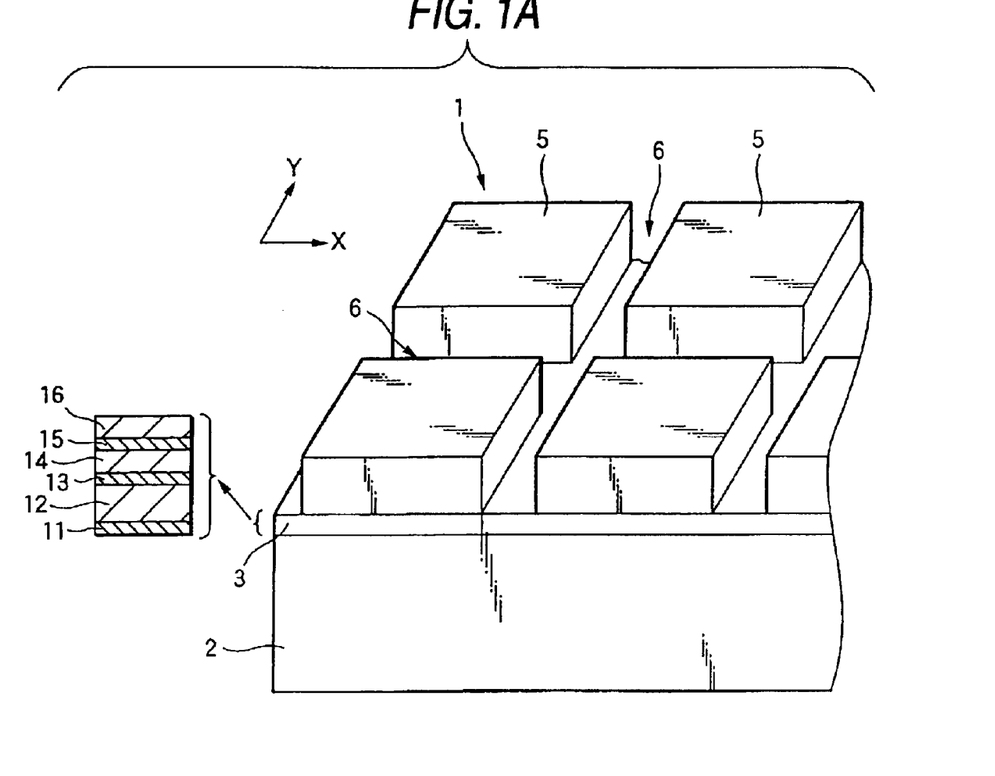
FIG. 1A and FIG. 1B are perspective views showing a method for dividing a semiconductor wafer into chips according to a first embodiment of the present invention.
Figure 1B:
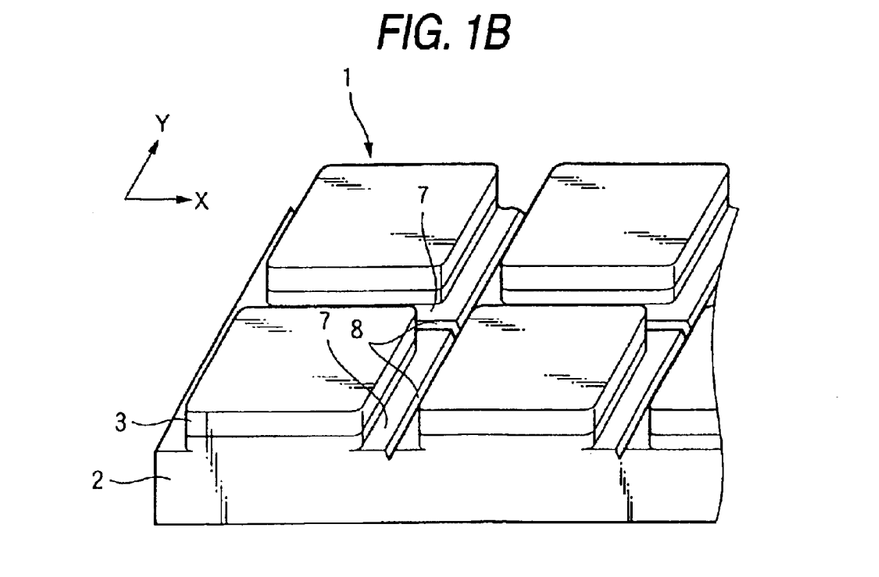
Figure 2A:
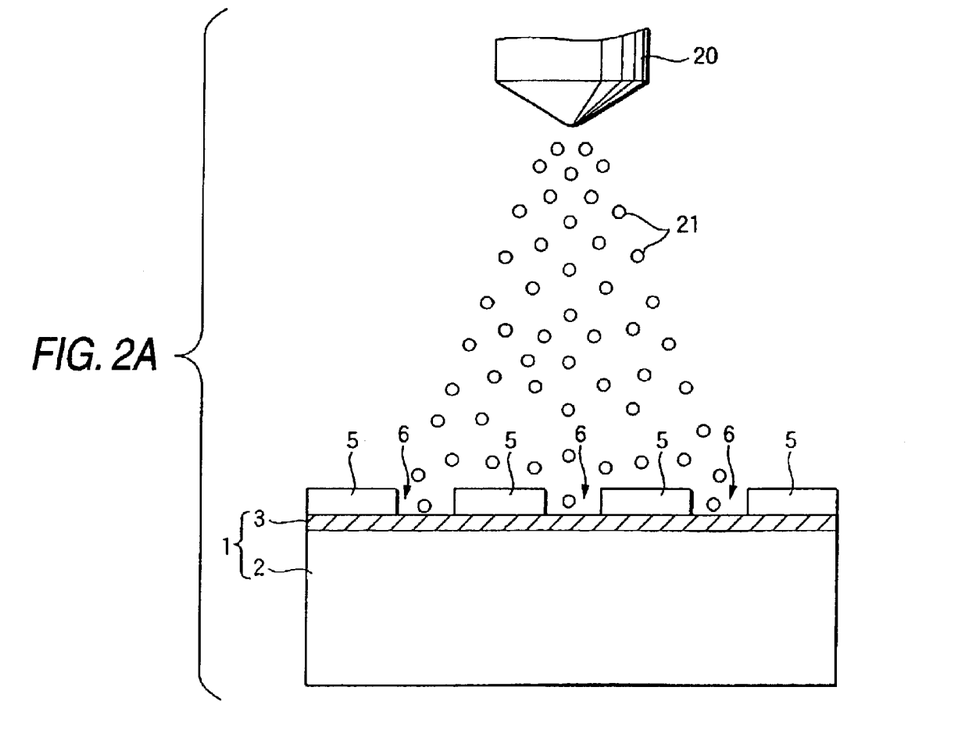
FIG. 2A to FIG. 2C are sectional views showing the first half of the steps of the same chip-dividing method.
Figure 2B:
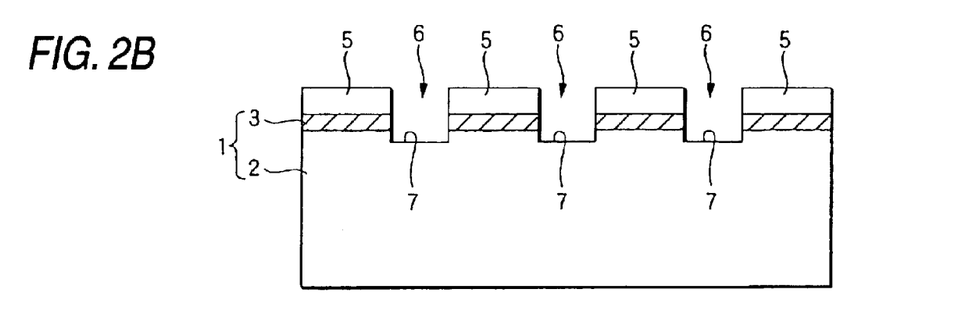
Figure 2C:
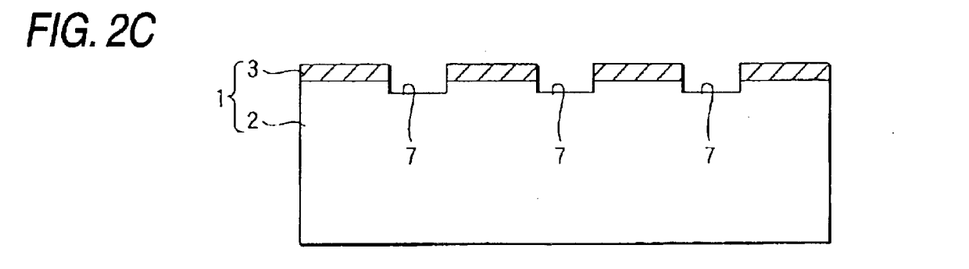
Figure 3A:
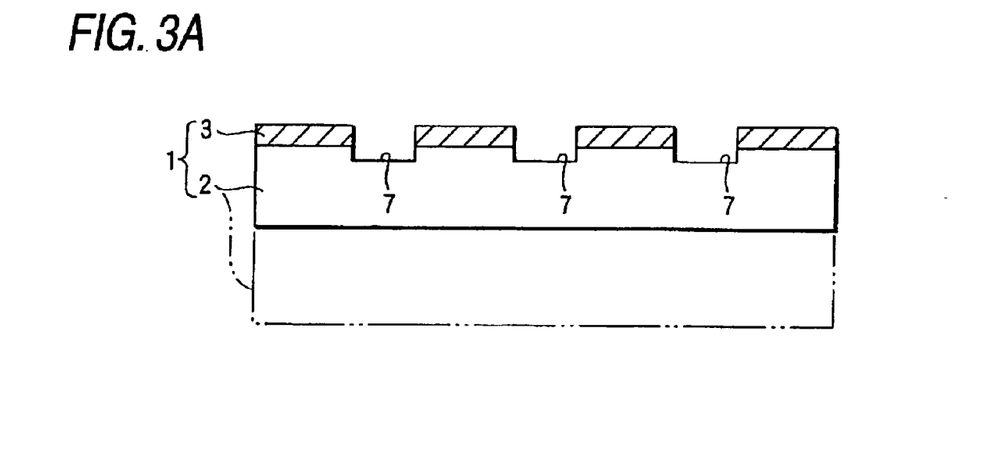
FIG. 3A to FIG. 3C are sectional views showing the second half of the steps of the same chip-dividing method.
Figure 3B:
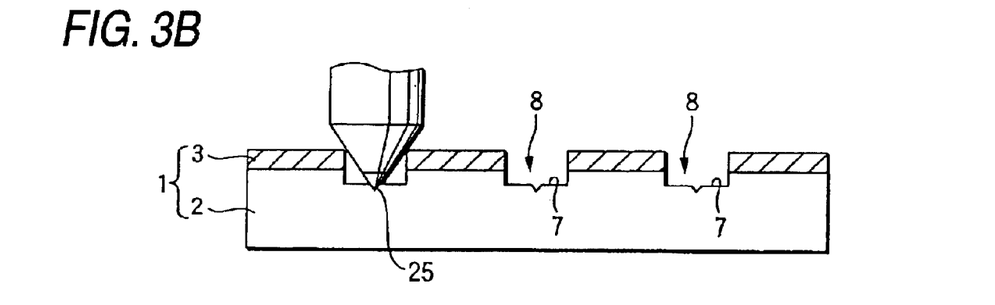
Figure 3C:
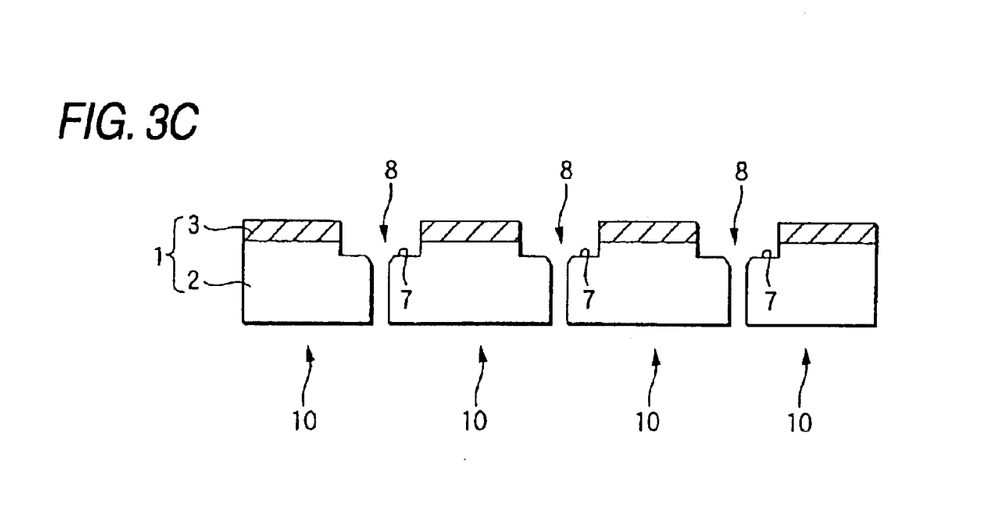

FIG. 1 to FIG. 3 shows a method for dividing a semiconductor wafer into chips according to a first embodiment of the present invention. First, description will be made on a semiconductor wafer 1 to be divided. The same wafer 1 is constituted by a substrate 2 and a semiconductor layer 3. The semiconductor layer 3 is formed on the surface of the substrate 2 so as to arrange a light emitting device (a light emitting diode, a laser diode, or the like). The same layer 3 is constituted by main layers 11 to 16 and electrodes (not shown).

The substrate 2 is made of sapphire, which is, for example, 2 inches (about 5 cm) square in the planar shape and 350 μm thick, and has an a-plane {11-20} in the surface on which the semiconductor layer will be formed. Incidentally, the substrate is not limited to this, but the material (for example, a substrate made of GaN may be used, and so on), the planar shape, the thickness, the crystalline plane, and so on may be changed appropriately.

Each of the main layers 11 to 16 is a gallium-nitride-based compound semiconductor (a buffer layer is made of AlN, but may be made of GaN) formed in a metallorganic vapor phase epitaxy method. First, the AlN buffer layer 11 is formed on the substrate 2. The Si-doped n-type GaN contact layer 12 is formed on the layer 11. The n-type GaN clad layer 13 is formed on the layer 12. The light emitting layer 14 having a multiple quantum well structure in which GaN barrier layers and InGaN well layers have been laminated alternately is formed on the layer 13. The Mg-doped p-type AlGaN clad layer 15 is formed on the layer 14. The Mg-doped p-type GaN contact layer 16 is formed on the layer 15. The total thickness of the main layers 11 to 16 is not limited particularly, but is, for example, 2–15 μm.

Incidentally, the main layers are not limited to this configuration. Suitable modifications may be made as follows. That is, the compositions of the respective layers may be changed. For example, the light emitting layer may be changed to have a single quantum well structure. When the substrate 2 is made of GaN, the buffer layer 11 may be omitted. In the case of a laser diode, a resonant structure may be provided.

Now, this semiconductor wafer 1 is divided into a large number of semiconductor chips in the following steps.

(1) As shown in FIG. 1A and FIG. 2A, a blast-resistant mask 5 having a pattern for leaving a grid-like exposed portion 6 as it is, is formed on the surface of the semiconductor wafer 1, for example, in which the semiconductor layer is formed. The method for forming the blast-resistant mask 5 is not limited particularly, but photolithography is adopted here. That is, a film with a photosensitive resist agent (masking agent) is pasted onto the semiconductor wafer 1, exposed to ultraviolet rays, developed with a weak alkaline solution, and dried. Thus, the blast-resistant mask 5 having the aforementioned pattern adheres onto the semiconductor wafer 1.

Each chip to be divided is about 350 μm square in the planar shape. Accordingly, the pitch between adjacent grid lines of the grid-like exposed portion 6 is 350 μm both in the x-direction and in the y-direction (see FIG. 1A and FIG. 1B). On the other hand, the dividing grooves 7 to be formed are about 20, 30, 40 or 50 μm wide. Accordingly, the respective grid lines of the grid-like exposed portion 6 are about 20, 30, 40 or 50 μm wide.

(2) This semiconductor wafer 1 is supported on a table (not shown) which can move in the x-y direction. While this table is moved to feed the semiconductor wafer 1 in the x-y direction which is the plane direction of the semiconductor wafer 1, a fine particle blast material 21 is blasted on the semiconductor wafer 1 from a nozzle 20 of a blasting machine so as to be spread over a plurality of grid lines of the grid-like exposed portion 6 as shown in FIG. 2A. Thus, a plurality of dividing grooves 7 are formed in the grid-like exposed portion 6 simultaneously so as to reach a predetermined depth of the substrate 2. This formation is done by the operation that the kinetic energy of the fine particle blast material 21 blasted at a high speed shaves parts of the semiconductor layer 3 and the substrate 2 appearing in the grid-like exposed portion 6 microscopically.

The distance between the semiconductor wafer 1 and the nozzle 20 is set to be about 50 mm. The feeding speed is set to be 50 mm/sec. The material of the fine particle blast material is set to be silicon carbide, and the average particle size thereof is set to be 8 μm (#2000 meshes) or 13 μm (#1200 meshes). The blasting rate is set to be 60–90 g/sec, and the blasting pressure is set to be about 0.4 MPa.

When one pass of blasting is carried out while feeding the semiconductor wafer 1 in such a manner, dividing grooves about 0.5 μm deep are formed in the semiconductor layer 3. Then, 15 passes of blasting are repeated when the average particle size is 8 μm, and 8 passes thereof are repeated when the average particle size is 13 μm. Thus, the depth of the dividing grooves is increased. Finally, as shown in FIG. 2B, the whole thickness of the semiconductor layer 3 is removed, and further the dividing grooves 7 are formed to reach the depth of about 5 μm in the substrate 2. When the dividing grooves 7 with the pitch of 350 μm are formed in the semiconductor wafer 1 about 2 inches square as in this embodiment, the time required for one pass is about 1 minute. Accordingly, the whole blasting can be terminated in about 15 minutes in the case of 15 passes. The whole blasting can be terminated in about 8 minutes in the case of 8 passes.

Incidentally, the blast-resistant mask 5 is also consumed little by little in this blasting. Particularly the whole thickness of each square planar corner portion is apt to be worn. Thus, as shown in FIG. 1B, even in the semiconductor layer 3 protected by the blast-resistant mask 5, a small radius is apt to be provided in each corner portion thereof.

(3) The blast-resistant mask 5 is removed chemically as shown in FIG. 2C.

(4) The surface of the 350 μm-thick substrate 2 in which the semiconductor layer is not formed is ground by a grinder so that the substrate 2 is thinned to be about 100 μm thick uniformly as shown in FIG. 3A.

(5) Scribe lines 8 are formed in the groove bottoms of the dividing grooves 7 by scribing with a scribing blade as shown in FIG. 1B and FIG. 3B.

(6) As shown in FIG. 3C, the semiconductor wafer 1 is divided into a large number of semiconductor chips 10 by breaking with the scribe lines 8 as starting points and along the scribe lines 8.

According to the chip-dividing method of this embodiment, the following effects can be obtained.

1) When the dividing grooves 7 are formed by blasting, cracking or chipping that might occur by dicing does not occur in the substrate 2 or the semiconductor layer 3. In addition, the semiconductor layer 3 which might suffer damage by etching does not suffer any damage. Accordingly, the yield is excellent. For example, the yield is improved by 10% or more in comparison with that by dicing.

2) Since a plurality of dividing grooves 7 can be formed simultaneously by blasting, all the dividing grooves 7 can be formed in a short time of 8–15 minutes in the semiconductor wafer 1 according to this embodiment as described previously. It would take about 120 minutes to carry out this, for example, by dicing. Accordingly, the machining time is shortened on a large scale so that the efficiency is enhanced.

3) The blasting machine or the fine particle blast material 21 (particularly silicon carbide) is inexpensive compared with an etching machine. In addition, the fine particle blast material 21 can be circulated and used repeatedly. It is therefore possible to reduce the equipment cost and the machining cost.

Figure 4A:
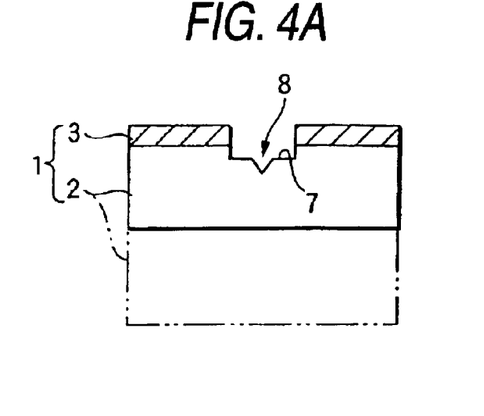
FIG. 4A to FIG. 4F are sectional views showing examples of the same chip-dividing method.
Figure 4B:
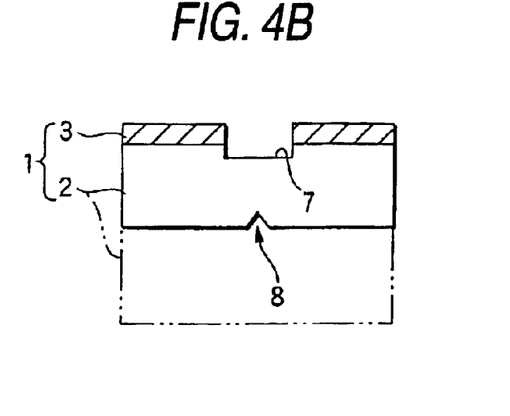
Figure 4C:
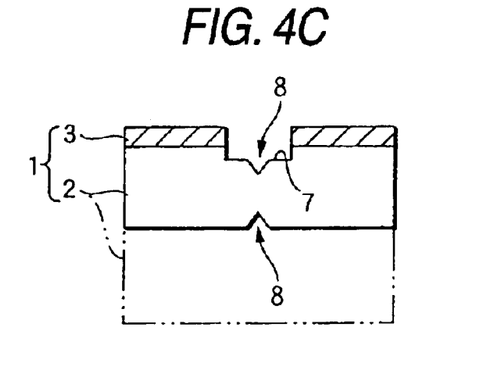

A group of Examples 1 shown schematically in FIG. 4A to FIG. 4C are to pack examples where the dividing grooves 7 are formed by blasting in the surface of the semiconductor wafer 1 in which the semiconductor layer is formed.

Example 1-1 shown in FIG. 4A is an example corresponding to the aforementioned first embodiment.

Example 1-2 shown in FIG. 4B is an example in which the dividing grooves 7 are formed in the surface of the semiconductor wafer 1 in which the semiconductor layer is formed, and then, a smooth surface newly appearing by polishing the substrate 2 on the side where the semiconductor layer is not formed is scribed to form the scribe lines 8.

Example 1-3 shown in FIG. 4C is an example in which a smooth surface newly appearing by polishing the substrate 2 on the side where the semiconductor layer is not formed is scribed to form the scribe lines 8 in addition to the aforementioned first embodiment.

Figure 4D:
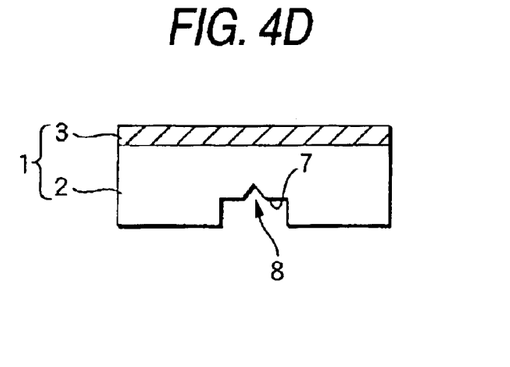
Figure 4E:
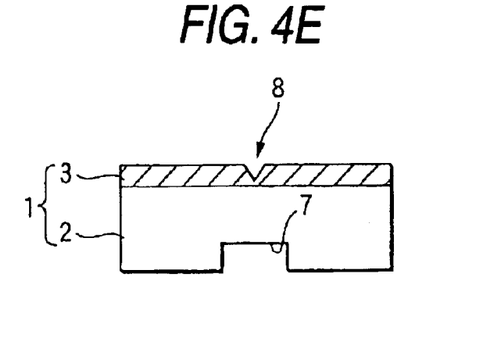
Figure 4F:
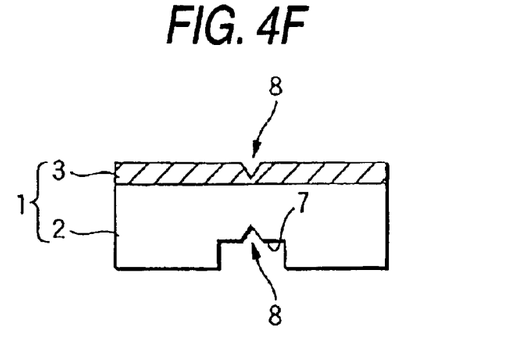

A group of Examples 2 shown schematically in FIG. 4D to FIG. 4F are to pack examples where the dividing grooves 7 are formed by blasting in the surface of the semiconductor wafer 1 in which the semiconductor layer is not formed.

Example 1-1 shown in FIG. 4D is an example in which the dividing grooves 7 are formed by the aforementioned blasting in the surface of the about 100 μm-thick substrate 2 in which the semiconductor layer is not formed, and then the scribe lines 8 are formed in the groove bottoms of the dividing grooves 7.

Example 2-2 shown in FIG. 4E is an example in which the dividing grooves 7 are formed by the aforementioned blasting in the surface of the about 100 μm-thick substrate 2 in which the semiconductor layer is not formed, and then, the scribe lines 8 are formed on the side where the semiconductor layer is formed.

Example 2-3 shown in FIG. 4F is an example in which the dividing grooves 7 are formed by the aforementioned blasting in the surface of the about 100 μm-thick substrate 2 in which the semiconductor layer is not formed, and then, the scribe lines 8 are formed in the groove bottoms of the dividing grooves 7, while the scribe lines 8 are formed on the side where the semiconductor layer is formed.

In each of Examples, the semiconductor wafer 1 is divided into a large number of semiconductor chips by breaking with the scribe lines 8 as starting points.

Incidentally, the present invention is not limited to the aforementioned embodiment. For example, the dividing grooves 7 may be formed to be deep (for example, 50 μm or more deep in the substrate 2) so that breaking can be achieved even without scribing.

Figure 5A:
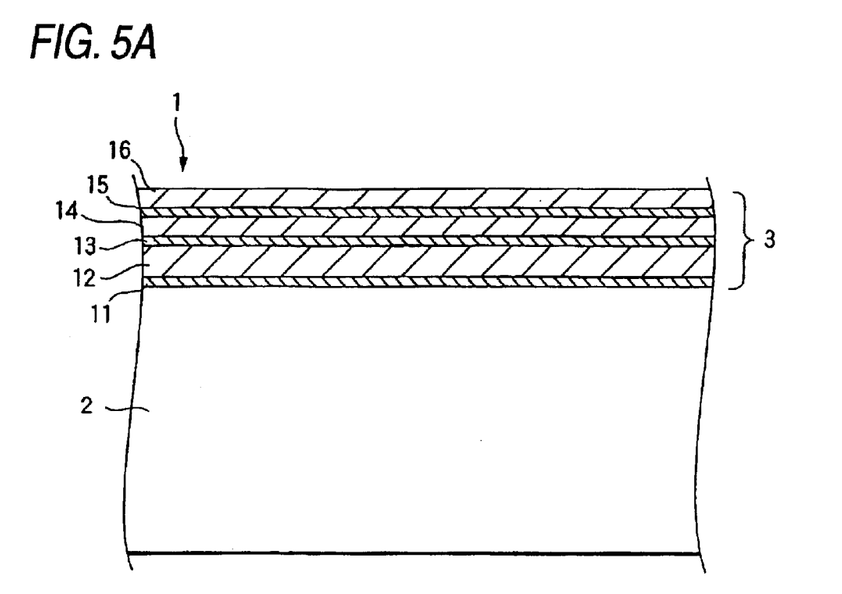
FIG. 5A is a sectional view of a semiconductor wafer to be divided in a method for dividing a semiconductor wafer into chips according to a second embodiment of the present invention.

Next, FIGS. 5 and 6 show a method for dividing a semiconductor wafer into chips according to a second embodiment of the present invention. As shown in FIG. 5A, a semiconductor wafer 1 to be divided has a basic configuration equivalent to that of the semiconductor wafer 1 shown in FIG. 1A and FIG. 1B. That is, the semiconductor wafer 1 is constituted by a substrate 2 and a semiconductor layer 3. The semiconductor layer 3 is formed on the surface of the substrate 2 so as to arrange a light emitting device (a light emitting diode, a laser diode, or the like). The same layer 3 is constituted by main layers 11 to 16 and electrodes (not shown). The substrate 2 and the main layers 11 to 16 may be made equivalent to those of the semiconductor wafer 1 shown in FIG. 1A and FIG. 1B.

FIG. 6 shows the second embodiment of the method for dividing the aforementioned semiconductor wafer 1 into chips, which is carried out in the following steps.

Figure 5B:
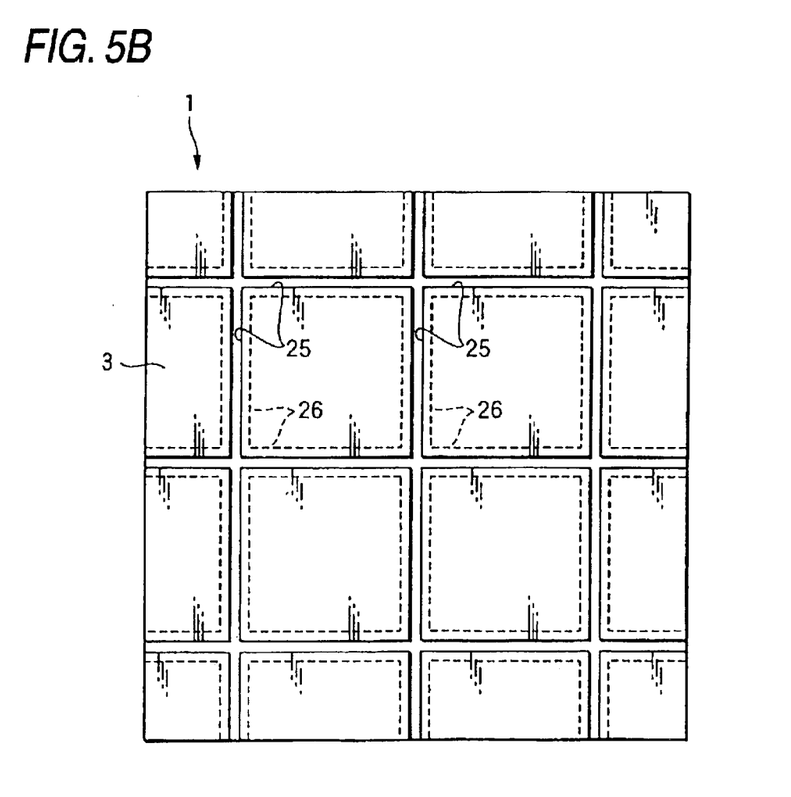
FIG. 5B is a plan view when dividing grooves have been formed in the semiconductor wafer.
Figure 6A:
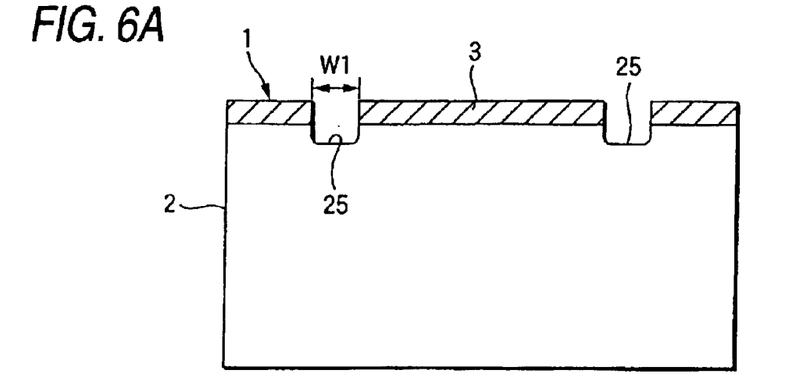
FIG. 6A to FIG. 6D are sectional views showing the chip-dividing method according to the second embodiment.

(1) As shown in FIG. 5B and FIG. 6A, first dividing grooves 25 whose groove width W1 is, for example, about 25 μm are formed by dicing, etching or blasting in the surface of the semiconductor wafer 1 in which the semiconductor layer is formed. Each semiconductor chip to be divided is about 350 μm square in the planar shape. Accordingly, the first dividing grooves 25 are formed in a planar grid-like arrangement with the pitch of 350 μm. In addition, as for the depth of the first dividing grooves 25, the whole thickness of the semiconductor layer 3 is removed, and further the first dividing grooves 25 are formed to reach, for example, the depth of about 15 μm in the substrate 2.

Figure 6B:
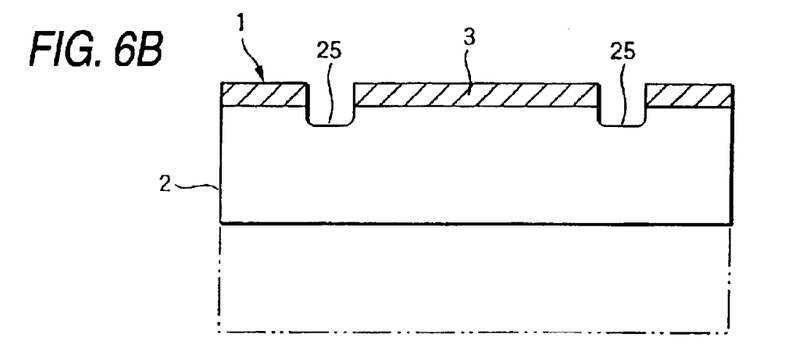

(2) As shown in FIG. 6B, the surface of the 350 μm-thick substrate 2 in which the semiconductor layer is not formed is ground by a grinder so that the substrate 2 is thinned to be about 100 μm thick uniformly.

Figure 6C:
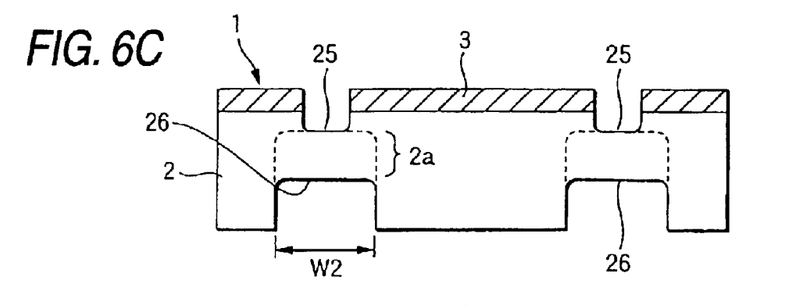

(3) As shown in FIG. 5B and FIG. 6C, second dividing grooves 26 whose groove width W2 is, for example, about 50 μm are formed by dicing in the surface of the semiconductor wafer 1 in which the semiconductor layer is not formed, and in positions corresponding to the aforementioned first dividing grooves 25. Although it will go well if the first dividing grooves 25 and the second dividing grooves 26 overlap each other partially in their groove widths, it is preferable that the first dividing grooves 25 stay within the range of the groove width of the second dividing grooves 26. It is more preferable that the central portions of those grooves in their groove width directions substantially agree with each other vertically. The second dividing grooves 26 are about 45 μm deep by way of example. Accordingly, residual portions 2a of the substrate 2 remaining between the first dividing grooves 25 and the second dividing grooves 26 are about 40 μm thick.

Figure 6D:
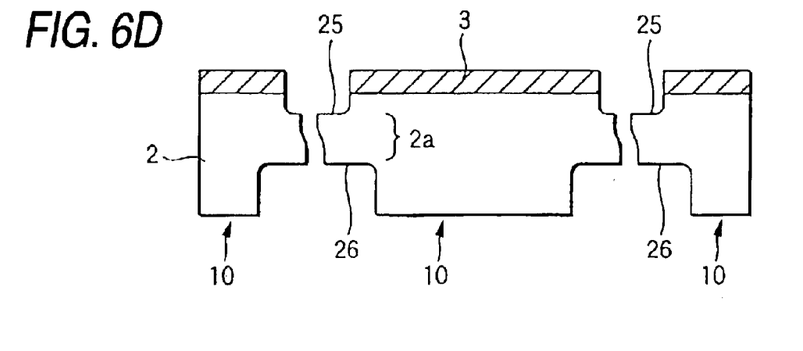

(4) As shown in FIG. 6D, the semiconductor wafer 1 is divided into a large number of semiconductor chips 10 by breaking in the residual portions 2a of the substrate 2.

According to the chip-dividing method of this embodiment, the following effects can be obtained.

1) The groove width W1 of the first dividing grooves 25 formed on the side of the substrate 2 where the semiconductor layer is formed is narrower than the groove width W2 of the second dividing grooves 26 formed on the side where the semiconductor layer is not formed. Accordingly, the area of the semiconductor layer 3 in each semiconductor chip 10 to be divided is increased so that the luminance can be enhanced. When the area is not increased, the number of semiconductor chips 10 yielded can be increased.

2) The groove width W2 of the second dividing grooves 26 formed on the side of the substrate 2 where the semiconductor layer is not formed is made larger than the groove width W1 of the first dividing grooves 25 formed on the side where the semiconductor layer is formed. Accordingly, a thick rotary blade having a tendency to have a long lifetime can be used as the rotary blade of the dicer for forming the second dividing grooves 26. As a result, the depth of the second dividing grooves 26 can be increased to thin the residual portions 2a and thereby facilitate breaking. In addition, the exchange cycle of the rotary blade becomes long so that the labor of exchange can be reduced, and the rotary blade cost can be also reduced.

Figure 7A:
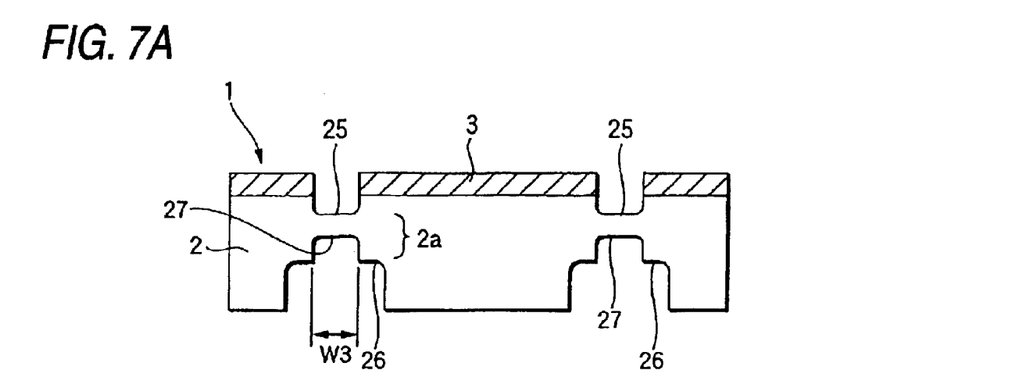
FIG. 7A is a sectional view showing the main point of a chip-dividing method according to a third embodiment.

A chip-dividing method according to a third embodiment shown in FIG. 7A is different from that according to the second embodiment only in that the following step is added to the second embodiment. That is, after the formation of the second dividing grooves 26 and before the breaking, third dividing grooves 27 are formed by dicing in the groove bottoms of the second dividing grooves 26 so as to establish the relationship that the groove width of the first dividing grooves 25 is not larger than the groove width of the third dividing grooves 27, and the groove width of the third dividing groove 27 is smaller than the groove width of the second dividing grooves 26. The groove width W3 of the third dividing grooves 27 in the illustrated example is about 25 μm (substantially as wide as the groove width W1 of the first dividing grooves 25), and the depth is, for example, about 20 μm from the groove bottoms of the second dividing grooves 26. Accordingly, the residual portions 2a of the substrate 2 become about 20 μm thick.

According to the third embodiment, the residual portions 2a of the substrate 2 become thinner. Accordingly, there can be obtained an effect that breaking can be facilitated more greatly, while cracks generated at the time of breaking stay within the groove width range of the third dividing grooves 27 (narrower than the groove width of the second dividing grooves 26) so that there is no case that the cracks run extremely obliquely.

Figure 7B:
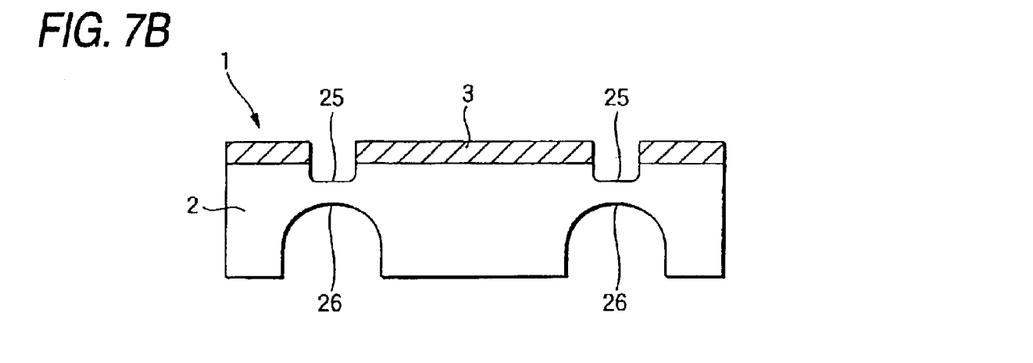
FIG. 7B is a sectional view showing the main point of a chip-dividing method according to a fourth embodiment.
Figure 7C:
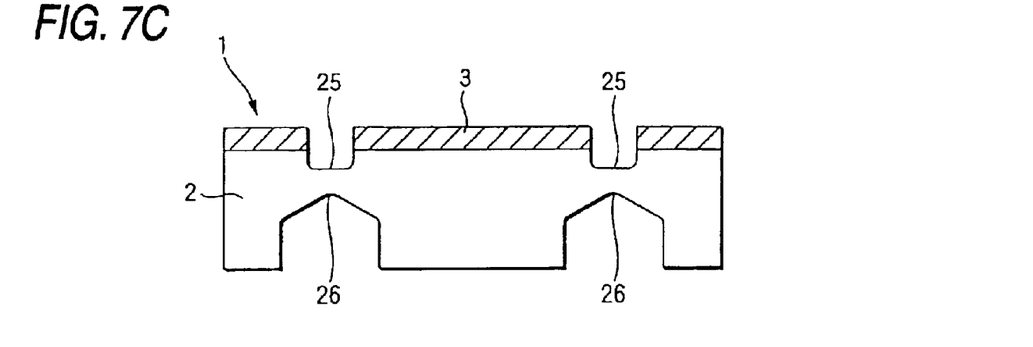
FIG. 7C is a sectional view showing the main point of a chip-dividing method according to a fifth embodiment.

A chip-dividing method according to a fourth embodiment shown in FIG. 7B is different from that according to the second embodiment in the following point. That is, when the second dividing grooves 26 are formed in the second embodiment, the groove sectional shape of the second dividing grooves 26 is made a substantially U-shape which is the deepest in the widthwise central portion thereof. In the same manner, a chip-dividing method according to a fifth embodiment shown in FIG. 7C is different from that according to the second embodiment in the following point. That is, the groove sectional shape of the second dividing grooves 26 is made a substantially V-shape which is the deepest in the widthwise central portion thereof.

According to the fourth or fifth embodiment, the residual portions 2a of the substrate 2 become the thinnest in the widthwise central portions of the second dividing grooves 26. Accordingly, there can be obtained an effect that cracking at the time of breaking is apt to occur in the central portions in question.

Figure 8A:
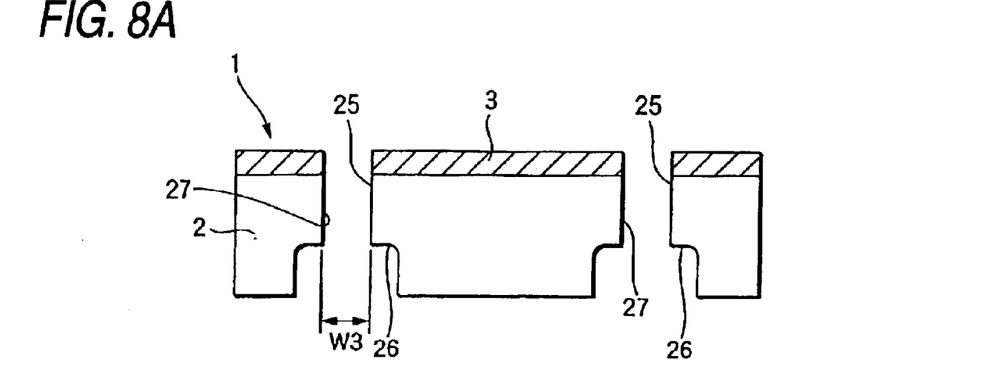
FIG. 8A to FIG. 8C are sectional views showing the main point of a chip-dividing method in which second dividing grooves or third dividing grooves are formed by dicing so as to reach first dividing grooves in the respective chip-dividing methods according to the third embodiment to the fifth embodiment.
Figure 8B:
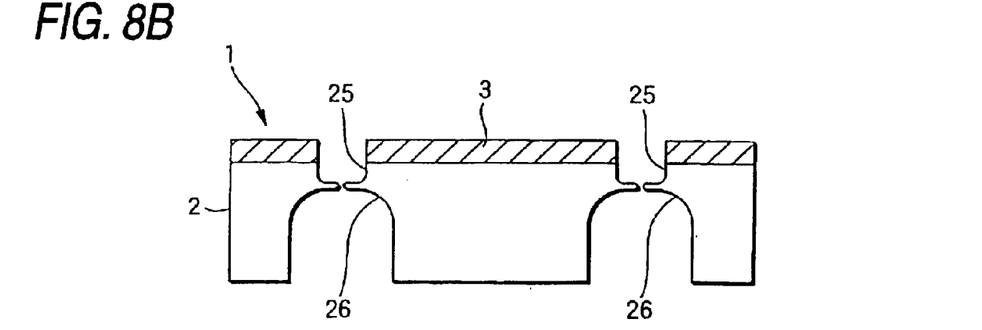
Figure 8C:
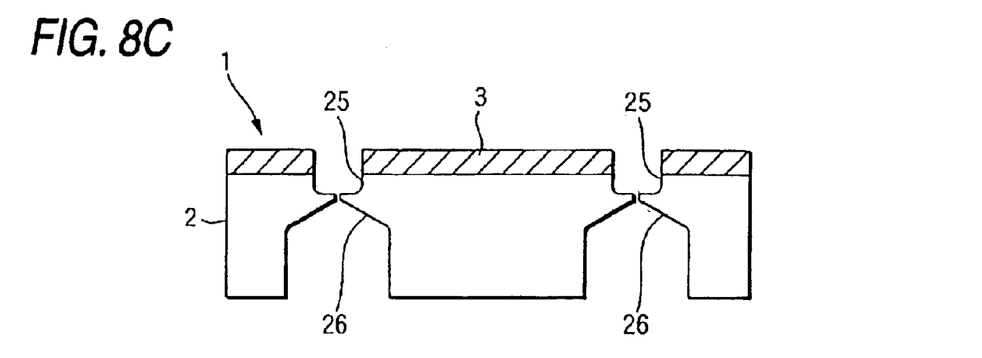

Further, FIG. 8A to FIG. 8C shows modifications of the aforementioned third to fifth embodiments. In these modifications, when the second dividing grooves 26 or the third dividing grooves 27 are formed, dicing is performed so that the second dividing grooves 26 or the third dividing grooves 27 reach the first dividing grooves. As a result, the aforementioned residual portions are not produced, but the semiconductor wafer can be divided directly into semiconductor chips. That is, the step of dividing the semiconductor wafer into the semiconductor chips by breaking with the residual portions as starting points can be omitted. Such dicing of the second dividing grooves 26 can be also applied to the chip-dividing method according to the second embodiment as shown by the dotted lines in FIG. 6C. In this case, the step of FIG. 6D is dispensable.

Incidentally, the present invention is not limited to the aforementioned embodiments. The semiconductor chips are not limited to light emitting devices, but may be formed as electronic devices such as light receiving devices, FETs, etc.

Further, the present invention is not limited to the aforementioned embodiments, but suitable modifications can be made specifically without departing from the gist of the invention.

INDUSTRIAL APPLICABILITY

As described above in detail, a method for dividing a semiconductor wafer into chips according to the present invention has the following excellent effects. That is, damage to a semiconductor layer is reduced so that the yield can be increased. In addition, the machining time is shortened so that the efficiency can be enhanced. Further, the equipment cost and the machining cost can be reduced.

Further, the method for dividing a semiconductor wafer into chips according to the present invention has the following excellent effects. That is, the area of the semiconductor layer in each semiconductor chip divided is increased so that the luminance can be enhanced or the number of semiconductor chips yielded can be increased, while breaking can be also facilitated.

What is claimed is:

1. A method for dividing a semiconductor wafer into a, said semiconductor wafer having a semiconductor layer formed on a substrate, comprising:

forming a blast-resistant mask on a surface of said semiconductor wafer, said blast-resistant mask having a pattern for leaving an exposed portion of said semiconductor wafer;

blasting a fine particle blast material to said semiconductor wafer to thereby form dividing grooves reaching a predetermined depth of said substrate in said exposed portion; and forming scribe lines by scribing in at least one of a bottom of said dividing grooves and in a surface of said semiconductor wafer opposite to said dividing grooves.

2. A method for dividing a semiconductor wafer according to claim 1, wherein said blasting comprises blasting said particle blast material so as to spread said fine particle blast material over a plurality of grid lines of said exposed portion while feeding said semiconductor wafer and a nozzle for blasting said particle blast material relatively to each other in a plane direction of said semiconductor wafer, such that a plurality of dividing grooves can be formed.

3. A method for dividing a semiconductor wafer according to claim 2, wherein a distance between said semiconductor wafer and said nozzle is from 10 µm to 150 µm.

4. A method for dividing a semiconductor wafer according to claim 2, wherein a speed of said feeding is from 5 mm/sec to 200 mm/sec.

5. A method for dividing a semiconductor wafer according to claim 2, wherein said blasting while feeding is repeated a predetermined pass number of times to increase a depth of said dividing grooves.

6. A method for dividing a semiconductor wafer according to claim 5, wherein said pass number of times is 3 passes to 20 passes.

7. A method for dividing a semiconductor wafer according to claim 1, wherein a width of said dividing grooves is from 10 µm to 500 µm.

8. A method for dividing a semiconductor wafer according to claim 1, wherein a depth of said dividing grooves in said substrate is from 1 µm to 100 µm.

9. A method for dividing a semiconductor wafer according to claim 1, wherein said substrate comprises a high hardness material having a Mohs hardness of at least 8.

10. A method for dividing a semiconductor wafer according to claim 1, wherein said substrate comprises at least one of sapphire and GaN, and said semiconductor layer comprises a gallium-nitride-based compound semiconductor.

11. A method for dividing a semiconductor wafer according to claim 1, wherein said particle blast material comprises a material having a Vickers hardness of at least 120.

12. A method for dividing a semiconductor wafer according to claim 1, wherein said particle blast material comprises at least one of alumina, silicon carbide, boron nitride, boron carbide and diamond.

13. A method for dividing a semiconductor wafer according to claim 1, wherein said dividing grooves are formed in a surface of said semiconductor wafer in which said semiconductor layer is formed.

14. A method for dividing a semiconductor wafer according to claim 1, wherein said dividing grooves are formed in a surface of said semiconductor wafer in which said semiconductor layer is not formed.

15. A method for dividing a semiconductor wafer according to claim 1, further comprising:

dividing said semiconductor wafer into semiconductor chips by breaking with said scribe lines as starting points.

16. A method for dividing a semiconductor wafer according to claim 1, wherein said blast-resistant mask comprises a pattern for leaving a grid-like exposed portion.

* * * * *